United States Patent
Kimber

(10) Patent No.: US 7,161,131 B2
(45) Date of Patent: Jan. 9, 2007

(54) MULTIPLE WAVELENGTH QUADRANT DETECTION

(75) Inventor: Paul Kevin Kimber, Basildon (GB)

(73) Assignee: Selex Sensors And Airborne Systems Limited, Basildon (GB)

(*) Notice: Subject to any disclaimer, the term of this patent is extended or adjusted under 35 U.S.C. 154(b) by 1570 days.

(21) Appl. No.: 10/238,906

(22) Filed: Jul. 30, 2002

(65) Prior Publication Data

US 2006/0266927 A1    Nov. 30, 2006

(30) Foreign Application Priority Data

Aug. 13, 2001  (GB) ................. 0119603.9

(51) Int. Cl.
  *G01J 1/42*   (2006.01)
  *G01B 11/26*  (2006.01)
  *G02B 5/32*   (2006.01)

(52) U.S. Cl. ............... 250/208.2; 250/206.1; 356/141.5; 359/19

(58) Field of Classification Search .......... 356/141.5; 359/15, 19; 250/206.1, 208.2

See application file for complete search history.

(56) References Cited

U.S. PATENT DOCUMENTS

| 4,092,531 A | * | 5/1978 | Moss ................. 250/216 |
| 4,181,435 A | * | 1/1980 | Williamson et al. |
| 4,185,919 A | * | 1/1980 | Williamson et al. ..... 356/141.5 |
| 4,231,533 A | * | 11/1980 | Durig .................. 244/3.16 |
| 6,493,490 B1 | * | 12/2002 | Steiger ................. 356/400 |
| 2002/0057632 A1 | * | 5/2002 | Alon et al. ............. 369/44.23 |

FOREIGN PATENT DOCUMENTS

EP           311340 A2  *  4/1989

* cited by examiner

*Primary Examiner*—Thomas H. Tarcza
*Assistant Examiner*—Isam Alsomiri
(74) *Attorney, Agent, or Firm*—Crowell & Moring LLP

(57) ABSTRACT

A quadrant detector includes a holographic optical element and a plurality of detector elements. The holographic optical element is designated to have four quadrants, each of which directs radiation incident thereon to an associated detector element. Signals from the detector elements are processed individually to optimise the performance of each detector element.

7 Claims, 2 Drawing Sheets

MULTIPLE WAVELENGTH QUADRANT DETECTION

FIELD OF THE INVENTION

The present invention relates to improvements in or relating to detectors, and is more particularly, although not exclusively, concerned with quadrant detectors.

BACKGROUND OF THE INVENTION

Quadrant detectors are used in many applications, but their usefulness can be limited by their operating wavelength which is dependent on the semiconductor material which is used for the detector elements. For example, detectors operating at a laser wavelength of 1.064 µm tend to comprise silicon based materials which are used close to their long wavelength limit. It is also known to 'extend' the laser wavelength range of a silicon based detector by heating the detector to around 70° C. This 'thermally' reduces the band gap.

It will readily be understood from the above discussion that silicon based detectors cannot be extended to 'eye safe' laser wavelength of 1.5 µm as is now required, and other detector materials will need to be utilised, for example, Si:Ge, InGaAs and other Group III/V materials.

Furthermore, producing a detector to operate at two or more wavelengths simultaneously, for example, at 1.064 µm and 1.5 µm, will require specialised materials and devices, such as sandwich structures, which are inherently difficult and expensive to manufacture into quadrant geometries.

SUMMARY OF THE INVENTION

It is therefore an object of the present invention to provide a detector arrangement which overcomes the problems discussed above.

In accordance with one aspect of the present invention, there is provided a method of detecting radiation from a scene using a quadrant detector, the method comprising:

providing separate quadrant separation function and optical detection functions.

In accordance with another aspect of the present invention, there is provided a quadrant detector comprising:

means for providing a quadrant separation function; and means for providing an optical detection function, the means for providing the optical detection function being separated from the means for providing the quadrant separation function.

It will readily be understood that the terms 'quadrant separation function' relates to dividing incoming radiation to produce four output signals and the term 'optical detection function' relates to the process of receiving radiation at a detector and its subsequent conversion to an electrical signal by the detector.

Adavantageously, the quadrant separation function is carried out by a holographic optical element, and the optical detection function by a plurality of detector elements, each detector element being associated with a quadrant formed by the holographic optical element.

Preferably, the holographic optical element has multiple wavelength capability. In this case a set of detector elements are provided for each wavelength and each detector element is associated with a quadrant.

BRIEF DESCRIPTION OF THE DRAWINGS

For a better understanding of the present invention, reference will now be made, by way of example only, to the accompanying drawings in which.

DETAILED DESCRIPTION OF THE INVENTION

According to the present invention, a quadrant detector is provided in which the quadrant separation function is separated from the optical to electrical detection function. This is achieved by using a holographic optical element (HOE) which 'focuses' or directs light incident on the HOE onto physically separated detectors. This is shown in FIG. 1.

Figure 1:
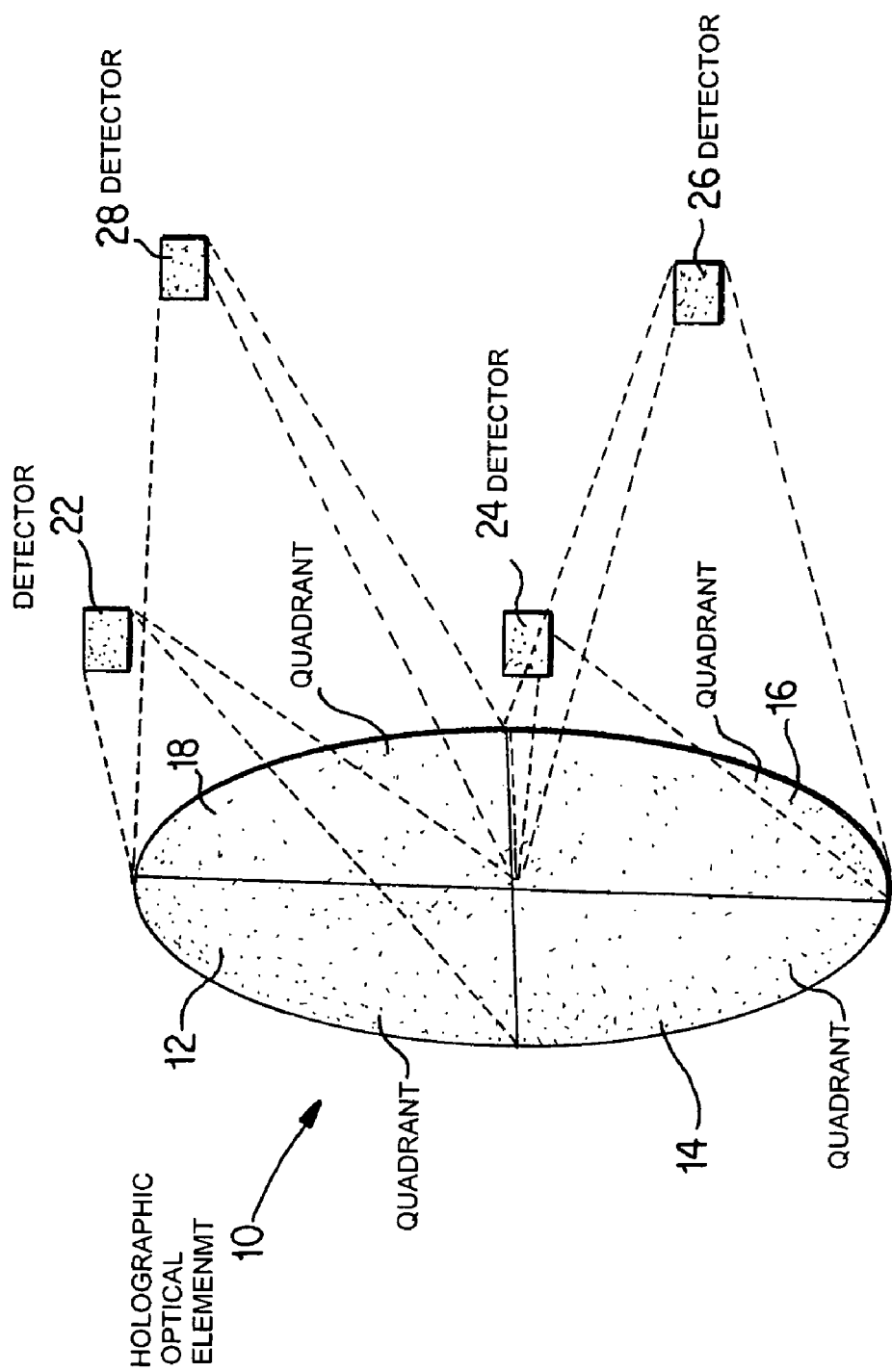
FIG. 1 illustrates one embodiment of a holographic based quadrant detector in accordance with the present invention.

FIG. 1 shows a holographic optical element (HOE) 10 which comprises quadrants 12, 14, 16, 18 as shown. Associated with each quadrant 12, 14, 16, 18 is a respective detector 22, 24, 26, 28. Each detector 22, 24, 26, 28 is a single wavelength detector and is separated from each of the other detectors. Each detector 22, 24, 26, 28 is connected to its own individual processor (not shown) which receives signals from its associated detector and provides an output signal indicative of the radiation received by the associated quadrant 12, 14, 16, 18 of the HOE 10.

The output signals received from each of the detectors 22, 24, 26, 28 are processed using conventional processing techniques to provide information relating to where an object in a scene is relative to the quadrants 12, 14, 16, 18. For example, a difference between the sums of vertical quadrant pair 12, 14 and quadrant pair 16, 18 provides azimuth information relating to the object relative to the centre of the element 10, and a difference between the sums of horizontal quadrant pair 12, 18 and quadrant pair 14, 16 provides elevation information relating to the object relative to the centre of element 10.

It will be appreciated that the HOE 10 provides a quadrant separation function which could be derived from, for example, a computer generator pattern.

It will be appreciated that, by separating the quadrant separation function from the optical to electrical detection mechanism, that is, the optical detection and subsequent conversion to an electrical signal, each detector and its associated processor can be optimised without compromising other detectors.

Naturally, although individual processors are described above, a single processor having four separate areas could also be used.

The embodiment described with reference to FIG. 1 operates at a single wavelength. However, the HOE may be made to operate at more than one wavelength. Such a HOE is shown in FIG. 2.

Figure 2:
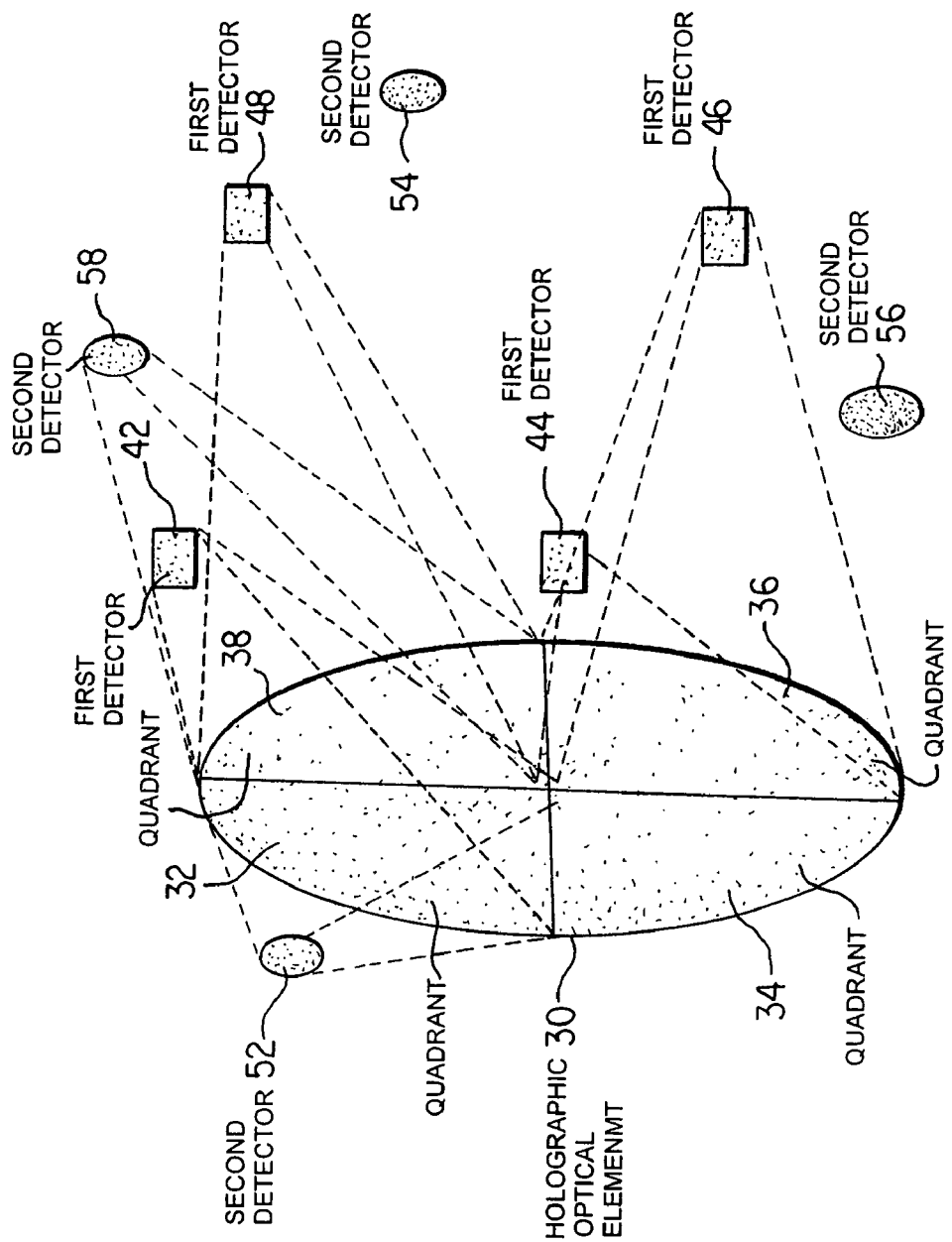
FIG. 2 illustrates a second embodiment of a holographic based quadrant detector having multiple wavelength capability in accordance with the present invention.

FIG. 2 shows a HOE 30 similar to HOE 10 of FIG. 1 but which has multiple wavelength capability. HOE 30 has quadrants 32, 34, 36, 38 each of which has a first detector 42, 44, 46, 48 operating at a first wavelength $\lambda_1$ and a second detector 52, 54, 56, 58 operating at a second wavelength $\lambda_2$ associated with it. As an example, $\lambda_1$ may be 1.064 µm and $\lambda_2$ may be 1.5 µm. As shown, the second detectors 52, 54, 56, 58 are spatially separated from the first detectors 42, 44, 46, 48. Again, each of the first and second detectors 42, 44, 46, 48, 52, 54, 56, 58 can be optimised without comprising any of the other detectors.

The HOE 30 shown in FIG. 2 has the advantage that images at two different wavelengths, $\lambda_1$ and $\lambda_2$, can be formed. It will be appreciated that a HOE may be designed to operate at more than two wavelengths and that a set of detectors is provided for each extra wavelength.

Holographic optical elements can be made in large sizes and at low cost, and therefore are viable alternatives to known quadrant detectors.

Apart from use in a quadrant detector as described above, HOEs may also have application in other electro-optic systems.

The invention claimed is:

1. A method of detecting radiation from a scene using a quadrant detector, the method comprising:

providing separate quadrant separation and optical detection functions, providing a holographic optical element as the quadrant separation function and a plurality of detector elements for the optical detection function, each detector element being associated with a quadrant formed by the holographic optical element, the holographic optical element having multiple wavelength capability, and providing a set of detector elements for each wavelength.

2. The method according to claim 1, wherein one wavelength is 1.064 µm.

3. The method according to claim 1, wherein one wavelength is 1.5 µm.

4. A quadrant detector comprising:

means for providing a quadrant separation function; and means for providing an optical detection function, the means for providing the optical detection function being separated from the means for providing the quadrant separation function, wherein the means for providing the quadrant separation function comprises a holographic optical element, wherein the means for providing the optical detection function comprises a plurality of detector elements, each detector element being associated with a quadrant formed by the holographic optical element, wherein the holographic optical element has multiple wavelength capability, and wherein a set of detector elements is provided for each wavelength.

5. The detector according to claim 4, wherein each detector element is associated with a quadrant formed by the holographic optical element.

6. The detector according to claim 4, wherein one wavelength is 1.064 µm.

7. The detector according to claim 4, wherein one wavelength is 1.5 µm.

* * * * *